(12) United States Patent
Nakatani et al.

(10) Patent No.: US 6,667,657 B2
(45) Date of Patent: Dec. 23, 2003

(54) RF VARIABLE GAIN AMPLIFYING DEVICE

(75) Inventors: Toshifumi Nakatani, Moriguchi (JP); Junji Ito, Hirakata (JP); Ikuo Imanishi, Otsu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/074,038

(22) Filed: Feb. 14, 2002

(65) Prior Publication Data

US 2002/0140502 A1 Oct. 3, 2002

(30) Foreign Application Priority Data

Mar. 27, 2001 (JP) .......................................... 2001-089650
Sep. 12, 2001 (JP) .......................................... 2001-275961

(51) Int. Cl.[7] .................................................. H03F 1/14
(52) U.S. Cl. ............................. 330/51; 330/53; 330/286
(58) Field of Search ............................... 330/51, 53, 86, 330/282, 286

(56) References Cited

U.S. PATENT DOCUMENTS

| | | | | |
|---|---|---|---|---|
| 5,051,705 A | * | 9/1991 | Moghe et al. | ............... 330/282 |
| 5,412,346 A | * | 5/1995 | Burger et al. | ............... 330/282 |
| 6,046,640 A | * | 4/2000 | Brunner | ....................... 330/254 |
| 6,127,886 A | * | 10/2000 | Khabbaz et al. | ............... 330/51 |
| 6,307,433 B1 | * | 10/2001 | Ikeda | ........................... 330/86 |
| 6,522,195 B2 | * | 2/2003 | Watanabe et al. | .............. 330/51 |

FOREIGN PATENT DOCUMENTS

JP 10-173453 6/1998

* cited by examiner

Primary Examiner—Khanh Van Nguyen
(74) Attorney, Agent, or Firm—Nixon Peabody, LLP

(57) ABSTRACT

An RF variable gain amplifying device has an amplifying circuit, a switch element connected in parallel with the amplifying circuit, and a resistor connected in parallel with the amplifying circuit and with the switch element. The amplifying circuit does not operate when the switch element is in the ON state but operates when the switch element is in the OFF state. A potential at each of the input and output terminals of the switch element is lower when the switch element is in the ON state than when the switch element is in the OFF state.

28 Claims, 9 Drawing Sheets

RF VARIABLE GAIN AMPLIFYING DEVICE

BACKGROUND OF THE INVENTION

The present invention relates to an RF variable gain amplifying device having a switch element for switching gain between different levels.

In a radio communication system represented by a mobile phone, a low noise characteristic and a high gain characteristic are required of an amplifying circuit in the initial stage of a receiving device when a small signal is received. In addition, a low distortion characteristic and a low gain characteristic are also required when a large signal is received. In recent mobile communication, in particular, the intensity of an electric field during reception greatly changes depending on the distance between a base station and a mobile station so that the receiving device requires a wide dynamic range. As a result, the low-noise amplifying circuit of a receiving front end unit is required to have a gain control function.

As an example of such an amplifying circuit having the gain control function, an RF variable gain amplifying device is disclosed in Japanese Laid-Open Patent Publication No. 10-173453.

FIG. 9 shows the RF variable gain amplifying device disclosed in the publication, which is an amplifying circuit in one of plural stages of amplifying circuits.

As shown in FIG. 9, an RF variable gain amplifying circuit 300 comprises: an amplifying circuit 310: and an RF switch element 320Q composed of a field effect transistor (FET) for opening and closing the signal bypass circuit of the amplifying circuit 310.

Between the amplifying circuit 310 and input and output nodes Ti and To, respective dc blocking capacitors Ci and Co are connected in series.

The amplifying circuit 310 includes an amplifying element 311 composed of a FET in a source-grounded configuration. To the gate of the amplifying element 311, an RF signal is supplied from an input node Ti via an input matching circuit 312 and a specified gate bias voltage Vgg is supplied through a resistor 313. The drain of the amplifying element 311 outputs an amplified signal to an output node To via an output matching circuit 315, while it is connected to a selection switch circuit 305 via a drain bias supply circuit 316.

The selection switch circuit 305 has a first input node a connected to a supply line for a power supply voltage Vdd and a second input node g which is grounded. Switching between the nodes a and g is performed by a power supply control circuit 307 which operates in accordance with power transmission control data or on the level of a received signal.

The RF switch element 320Q uses a depletion-type FET having a drain connected to the input node Ti via a dc blocking capacitor 303c, a source connected to the drain of the amplifying element 311, and a gate connected to the ground via the resistor 306.

In the conventional RF variable gain amplifying device 300 thus constructed, the power supply voltage Vdd is supplied to the amplifying circuit 310 via the selection switch circuit 305 under the control of the power supply control circuit 307, while the selection switch circuit 305 is connected to the first input node a, whereby the amplifying circuit 310 is brought into an operating state. The power supply voltage Vdd applied via the selection switch circuit 305 is supplied as a control signal to the RF switch element 320Q so that a gate-source voltage in the RF switch element 320Q is lowered to bring the RF switch element 320Q into an OFF state and bring the connection of the signal bypass circuit into an open state. In the open state, a high-gain operating mode is established in which the level of an output RF signal at the output node To is higher than the level of an input RF signal at the input node Ti by the gain of the amplifying circuit 310.

If the selection switch circuit 305 is switched to the second input node g, on the other hand, the supply of the power supply voltage Vdd to the amplifying circuit 310 is cut off so that the operation of the amplifying circuit 310 halts, while a ground potential is supplied as a control signal via the selection switch circuit 305 to bring the RF switch element 320Q into an ON state and bring the signal bypass circuit into a connected state. When the signal bypass circuit is in the connected state, a low-gain operating mode is established in which the level of the output RF signal at the output node To is lower than the level of the input RF signal at the input node Ti by the sum of a loss resulting from the insertion of the RF switch element 320Q and a loss resulting from mismatched impedances at the input node Ti.

By thus switching the RF amplifying device to the high-gain operating mode if the level of the RF signal inputted to the input node Ti is lower than a specified level and switching the RF amplifying device to the low-gain operating mode if the level of the RF signal inputted to the input node Ti is higher than the specified level, the RF amplifying device capable of handling an RF signal with a wide dynamic range can be implemented.

When the conventional RF variable gain amplifying device is in the high-gain operating mode in which the selection switch circuit 305 is switched to the first input node a, however, the drain of the RF switch element 320Q is brought into a floating state. This causes the problem that a residual charge in the floating state varies a drain potential and the varied drain potential varies isolation when the RF switch element 320Q is in the OFF state.

SUMMARY OF THE INVENTION

It is therefore an object of the present invention to prevent varying isolation when an RF switch element provided in a signal bypass circuit is in the OFF state by solving the foregoing conventional problems.

To attain the object, the present invention constructs an RF variable gain amplifying device such that the electrode of the switch element for signal bypass circuit is not brought into the floating state.

Specifically, a first RF variable gain amplifying device according to the present invention comprises: an amplifying circuit; a switch element connected in parallel with the amplifying circuit; and a resistor connected in parallel with the amplifying circuit and with the switch element, the amplifying circuit not operating when the switch element is in an ON state but operating when the switch element is in an OFF state, a potential at each of input and output terminals of the switch element being lower when the switch element is in the ON state than when the switch element is in the OFF state.

Since the first RF variable gain amplifying device comprises the resistor connected in parallel with the amplifying circuit and with the switch element, the electrode of the switch element is not brought into the floating state even if the switch element is in the OFF state and the amplifying circuit is in the ON state, i.e., in a high gain state (in the high-gain operating mode). Accordingly, isolation does not vary and isolation provided by the switch element is increased. If the switch element is in the ON state and the amplifying circuit is in the OFF state, i.e., in a low gain state (in the low-gain operating mode), on the other hand, an insertion loss when the switch element is in the ON state is reduced.

In the first RF variable gain amplifying device, the amplifying circuit preferably has a bipolar transistor, an input signal to the amplifying circuit is preferably inputted to a base of the bipolar transistor, and an output signal from the amplifying circuit is preferably outputted from a collector of the bipolar transistor. In the arrangement, if a base potential is adjusted to approximately zero so that a collector current becomes approximately zero when the amplifying circuit is in the OFF state, a potential at each of the input and output terminals of the switch element can be lowered more reliably when the amplifying circuit is in the OFF state (when the switch element is in the ON state) than when the amplifying circuit is in the ON state (when the switch element is in the OFF state).

In the first variable gain amplifying device, the amplifying circuit preferably has a first bipolar transistor and a second bipolar transistor having an emitter connected to a collector of the first bipolar transistor, an input signal to the amplifying circuit is preferably inputted to a base of the first bipolar transistor, and an output signal from the amplifying circuit is preferably outputted from a collector of the second bipolar transistor. In the arrangement, the first and second bipolar transistors are in a cascode connection. This allows amplification of an input signal having a higher frequency. If a potential at the base of the second bipolar transistor is adjusted to approximately zero, the second bipolar transistor does not operate even if a signal of a strong electric field is inputted to the first bipolar transistor.

In this case, a potential at a base of the second bipolar transistor is preferably lower when the switch element is in the ON state than when the switch element is in the OFF state. In the arrangement, a potential at the collector of the first bipolar transistor becomes lower than the power supply voltage. This allows a reduction in the level of distortion of the output signal in the low-gain operating mode.

In the first RF variable gain amplifying device, a strip line is preferably provided between the input terminal of the amplifying circuit and the switch element. By properly setting the characteristic impedance or length of the strip line, the arrangement allows the input impedance of the amplifying circuit to be changed so that input and output impedances in the high-gain operating mode are brought closer to those in the low-gain operating mode. This reduces a loss resulting from mismatched impedances at the input and output terminals in each of the high-gain and low-gain operating modes.

In the first RF variable gain amplifying device, a strip line is preferably provided between the output terminal of the amplifying circuit and the switch element.

In the first RF variable gain amplifying device, a coplanar line is preferably provided between the input terminal of the amplifying circuit and the switch element.

In the first RF variable gain amplifying device, a coplanar line is preferably provided between the output terminal of the amplifying circuit and the switch element.

In the first RF variable gain amplifying device, an inductor element is preferably provided between the input terminal of the amplifying circuit and the switch element.

In the first RF variable gain amplifying device, an inductor element is preferably provided between the output terminal of the amplifying circuit and the switch element.

In the first RF variable gain amplifying device, another resistor is preferably provided in a stage subsequent to the switch element. The arrangement reduces variations in loss resulting from the insertion of the switch element and thereby widens the dynamic range of an inputted RF signal.

In the first RF variable gain amplifying device, the switch element is preferably composed of a field effect transistor having a gate electrode formed on a semiconductor substrate and source and drain layers of a first conductivity type each formed in the semiconductor substrate, the source and drain layers are preferably formed in a first well of a second conductivity type of the semiconductor substrate, and the first well is preferably formed in a second well of the first conductivity type of the semiconductor substrate. In the arrangement, the application of respective reverse bias voltages between the first and second wells and between the second well and the semiconductor substrate forms a depletion layer due to a pn junction, which dielectrically isolates each of the wells from the semiconductor substrate. As a result, a loss in input signal resulting from the leakage of an inputted RF signal to the semiconductor substrate can be reduced when the switch element is in the ON state.

In this case, respective resistors are preferably provided between the gate electrode and a voltage control node, between the first well and a ground node, and between the second well and a power supply voltage node. The arrangement reduces a loss in input signal resulting from the leakage of the inputted RF signal from the gate electrode, the first well, and the second well to a ground for RF.

Alternatively, respective inductor elements are preferably provided between the gate electrode and a voltage control node, between the first well and a ground node, and between the second well and a power supply voltage node.

A second RF variable gain amplifying device according to the present invention comprises: first and second amplifying circuits for receiving first and second input signals, respectively; first and second switch elements connected in parallel with the first and second amplifying circuits, respectively; a first resistor connected in parallel with the first amplifying circuit and with the first switch element; and a second resistor connected in parallel with the second amplifying circuit and with the second switch element, the first amplifying circuit not operating when the first switch element is in an ON state but operating when the first switch element is in an OFF state, the second amplifying circuit not operating when the second switch element is in an ON state but operating when the second switch element is in an OFF state, a potential at each of input and output terminals of the first switch element being lower when the first switch element is in the ON state than when the first switch element is in the OFF state, a potential at each of input and output terminals of the second switch element being lower when the second switch element is in the ON state than when the second switch element is in the OFF state.

Since the second RF variable gain amplifying device according to the present invention adopts a configuration of a differential amplifying circuit, isolation when the first and second switch elements are in the OFF state is increased in the high-gain operating mode in which the first and second amplifying circuits are in the ON state and the first and second switch elements are in the OFF state. In the low-gain operating modes in which the first and second amplifying circuits are in the OFF state and the first and second switch elements are in the ON state, an insertion loss when the first and second switch elements are in the ON state is reduced.

In the second RF variable gain amplifying device, a third resistor is preferably provided between the output terminal of the first amplifying circuit and the first switch element, a fourth resistor is preferably provided between the output terminal of the second amplifying circuit and the second switch element, a fifth resistor is preferably provided between respective input terminals of the third and fourth resistors, and a sixth resistor is preferably provided between respective output terminals of the third and fourth resistors. In the arrangement, the third, fourth, fifth, and sixth resistors constitute a π-type attenuator. This allows the attenuation of an RF signal inputted in the low-gain operating mode. In addition, variations in low-gain operation are reduced. Since the π-type attenuator allows the adjustment of input and output impedances, the input and output impedances in the high-gain operating mode can be brought closer to those in the low-gain operating mode. This reduces a loss resulting from mismatched impedances at the input and output terminals in each of the operating modes.

In the second RF variable gain amplifying device, the first and second amplifying circuits preferably have respective bipolar transistors, an input signal to the first amplifying circuit is preferably inputted to a base of the bipolar transistor of the first amplifying circuit, while an output signal from the first amplifying circuit is outputted from a collector of the bipolar transistor of the first amplifying circuit, and an input signal to the second amplifying circuit is preferably inputted to a base of the bipolar transistor of the second amplifying circuit, while an output signal from the second amplifying circuit is outputted from a collector of the bipolar transistor of the second amplifying circuit. In the arrangement, a potential at each of the input and output terminals of the first and second switch elements can be reduced more reliably when the first and second amplifying circuits are in the OFF state (when the first and second switch elements are in the ON state) than when the first and second amplifying circuits are in the ON state (when the first and second switch elements are in the OFF state).

In the second RF variable gain amplifying device, the first amplifying circuit preferably has a first bipolar transistor and a second bipolar transistor having an emitter connected to a collector of the first bipolar transistor, an input signal to the first amplifying circuit is preferably inputted to a base of the first bipolar transistor, while an output signal from the first amplifying circuit is outputted from a collector of the second bipolar transistor, the second amplifying circuit preferably has a third bipolar transistor and a fourth bipolar transistor having an emitter connected to a collector of the third bipolar transistor, and an input signal to the second amplifying circuit is preferably inputted to a base of the third bipolar transistor and an output signal from the second amplifying circuit is preferably outputted from a collector of the fourth bipolar transistor.

In this case, a potential at a base of the second bipolar transistor is preferably lower when the first switch element is in the ON state than when the first switch element is in the OFF state and a potential at a base of the fourth bipolar transistor is preferably lower when the second switch element is in the ON state than when the second switch element is in the OFF state.

In the second RF variable gain amplifying device, respective strip lines are preferably provided between the input terminal of the first amplifying circuit and the first switch element and between the input terminal of the second amplifying circuit and the second switch element.

In the second RF variable gain amplifying device, respective strip lines are preferably provided between the output terminal of the first amplifying circuit and the first switch element and between the output terminal of the second amplifying circuit and the second switch element.

In the second RF variable gain amplifying device, respective coplanar lines are preferably provided between the input terminal of the first amplifying circuit and the first switch element and between the input terminal of the second amplifying circuit and the second switch element.

In the second RF variable gain amplifying device, respective coplanar lines are preferably provided between the output terminal of the first amplifying circuit and the first switch element and between the output terminal of the second amplifying circuit and the second switch element.

In the second RF variable gain amplifying device, respective inductor elements are preferably provided between the input terminal of the first amplifying circuit and the first switch element and between the input terminal of the second amplifying circuit and the second switch element.

In the second RF variable gain amplifying device, respective inductor elements are preferably provided between the output terminal of the first amplifying circuit and the first switch element and between the output terminal of the second amplifying circuit and the second switch element.

In the second RF variable gain amplifying device, each of the first and second switch elements is preferably composed of a field effect transistor having a gate electrode formed in a semiconductor substrate and source and drain layers of a first conductivity type each formed in the semiconductor substrate, the source and drain layers are preferably formed in a first well of a second conductivity type of the semiconductor substrate, and the first well is preferably formed in a second well of the first conductivity type of the semiconductor substrate.

In the second RF variable gain amplifying device, respective resistors are preferably provided between the gate electrode and a voltage control node, between the first well and a ground node, and between the second well and a power supply voltage node.

In the second RF variable gain amplifying device, respective inductor elements are preferably provided between the gate electrode and a voltage control node, between the first well and a ground node, and between the second well and a power supply voltage node.

DETAILED DESCRIPTION OF THE INVENTION

Embodiment 1

Figure 1:
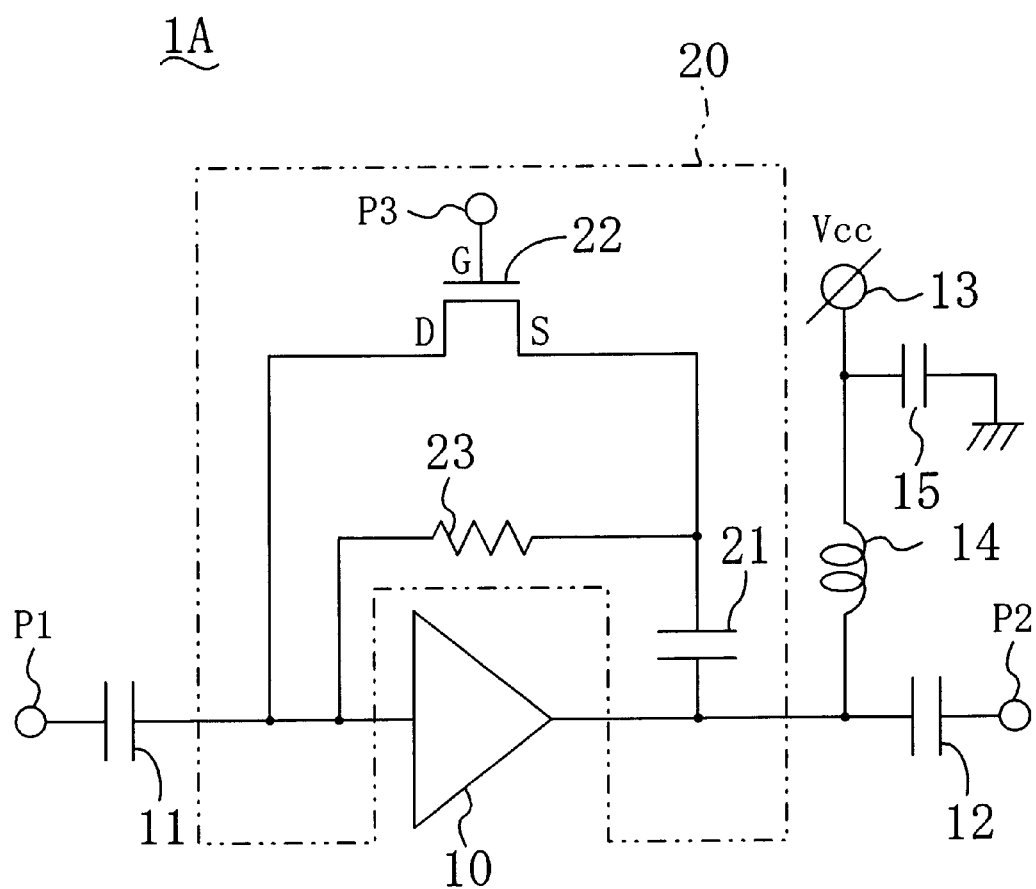
FIG. 1 is a circuit diagram showing an RF variable gain amplifying device according to a first embodiment of the present invention.

Referring now to the drawings, a first embodiment of the present invention will be described.

FIG. 1 shows a circuit configuration of an RF variable gain amplifying device according to the first embodiment.

As shown in FIG. 1, an RF variable gain amplifying device 1A according to the first embodiment has: an amplifying circuit 10 connected to an input terminal P1 via an input dc blocking capacitor 11 and to an output terminal P2 via an output dc blocking capacitor 12; a signal bypass circuit 20 connected between the input and output capacitors 11 and 12 in parallel with the amplifying circuit 10; and a choke coil 14 having one end connected to a power supply terminal 13 for supplying a power supply voltage Vcc of about 3 V and the other end connected between the output terminal of the amplifying circuit 10 and the output capacitor 12. The power supply terminal 13 is also connected to a bypass capacitor 15 which is grounded.

The signal bypass circuit 20 is composed of: an RF switch element 22 having a gate connected to a voltage control terminal P3, a drain connected between the input capacitor 11 and the input terminal of the amplifying circuit 10, and a source connected between the output terminal of the amplifying circuit 10 and the output capacitor 12 via a dc blocking capacitor 21 for bypass circuit; and a resistor 23 for preventing varying isolation which is connected in parallel with the RF switch element 22 between the drain and source of the RF switch element 22.

In the present specification, terminals such as the voltage control terminal P3 include such a terminal as a pad electrode and a node which is a connecting point for elements in wiring.

Figure 2:
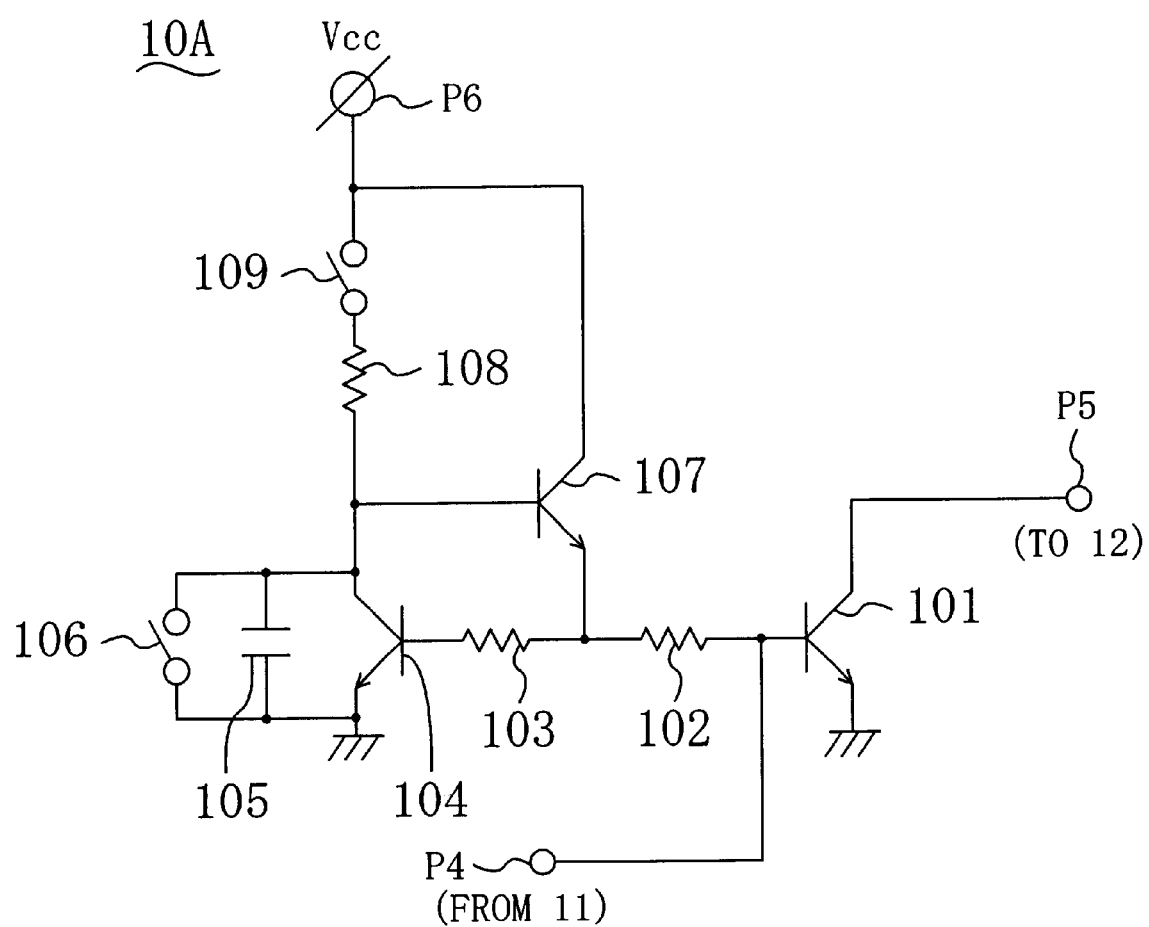
FIG. 2 is a circuit diagram of an exemplary amplifying circuit in the RF variable gain amplifying device according to the first embodiment.

FIG. 2 shows an exemplary circuit configuration of an amplifying circuit 10A according to the first embodiment.

As shown in FIG. 2, the amplifying circuit 10A has a first bipolar transistor 101 having an emitter which is grounded, a base connected to an input node P4 for receiving an input signal from the input capacitor 11, and a collector connected to an output node P5 for transmitting an output signal to the output capacitor 12. The first bipolar transistor 101 amplifies an RF signal inputted to the RF variable gain amplifying device 1A.

The first bipolar transistor 101 has a base connected to the base of a second bipolar transistor via the first and second resistors 102 and 103 connected in series.

The second bipolar transistor 104 has an emitter which is grounded. A bypass capacitor 105 and a first DC switch 106 composed of, e.g., an n-channel FET are connected in parallel between the collector and emitter of the second bipolar transistor 104. The collector of the second bipolar transistor 104 is connected to the base of a third bipolar transistor 107, while it is connected to a power supply terminal P6 via a third resistor 108 and a second DC switch 109 composed of, e.g., a p-channel FET which are connected in series.

The third bipolar transistor 107 has a collector connected to the power supply terminal P6 and an emitter connected to a common connecting portion of the first and second resistors 102 and 103.

A description will be given herein below to the operation of the RF variable gain amplifying device according to the first embodiment thus constructed.

High-Gain Operating Mode

If the level of a received RF signal is lower than a specified value, the high-gain operating mode is established. As a result, a voltage value at the voltage control terminal P3 shown in FIG. 1 becomes appropriately 0 V. In the amplifying circuit 10A shown in FIG. 2, the first DC switch 106 is brought into an OFF state and the second DC switch 109 is brought into an ON state so that the base bias voltage of the first bipolar transistor 101 becomes approximately 0.7 V.

Consequently, a potential at the drain of the RF switch element 22 shown in FIG. 1 becomes approximately 0.7 V, which is equal to a potential at the input node P2 shown in FIG. 2, and a potential at the source of the RF switch element 22 which is connected to the drain thereof via the resistor 23 also becomes approximately 0.7 V. Accordingly, the base voltage of the first bipolar transistor 101 becomes approximately 0.7 V so that the amplifying circuit 10A is brought into the ON state. On the other hand, the voltage between the gate of the RF switch element 22 and the back gate thereof, which is fixed to 0 V, becomes approximately 0 V so that the RF switch element 22 is brought into the OFF state.

Low-Gain Operating Mode

If the level of a received RF signal is higher than the specified value, the low-gain operating mode is established to prevent, e.g., the saturation of the amplifying circuit 10A. As a result, the voltage value at the voltage control terminal P3 shown in FIG. 1 becomes the power supply voltage Vcc. In the amplifying circuit 10A shown in FIG. 3, the first DC switch 106 is brought into the ON state and the second DC switch 109 is brought into the OFF state so that the base bias voltage of the first bipolar transistor 101 becomes approximately 0 V.

Consequently, a voltage at the drain of the RF switch element 22 becomes approximately 0 V, which is equal to a potential at the input node P4 shown in FIG. 2, and a voltage at the source of the RF switch element 22 which is connected to the drain thereof via the resistor 23 also becomes approximately 0 V. Accordingly, the base voltage of the first bipolar transistor 101 becomes approximately 0 V so that the amplifying circuit 10A is brought into the OFF state. On the other hand, the voltage between the gate of the RF switch element 22 and the back gate thereof becomes approximately the power-supply voltage Vcc so that the RF switch element 22 is brought into the ON state.

According to the first embodiment, the drain and source of the RF switch element 22 are connected via the resistor 23 in the RF variable gain amplifying device 1A so that neither the drain nor source of the RF switch element 22 is brought into the floating state. As a result, a potential at the source or drain does not vary even in the high-gain operating mode and therefore steady isolation is retained while the RF switch element 22 is in the OFF state.

Since the potential at each of the drain and source of the RF switch element 22 composed of the n-channel FET becomes approximately 0.7 V in the high-gain operating mode, the isolation when the RF switch element 22 is in the OFF state is increased compared with the case where the potential at each of the drain and source is 0 V.

If the RF switch element 22 is formed in a semiconductor substrate composed of silicon (Si), the floating capacitance between the semiconductor substrate and the drain and source when the potential at each of the drain and source is approximately 0.7 V is reduced compared with the case where the potential at each of the drain and source is 0 V so that the noise characteristic of the RF variable gain amplifying device 1A is improved.

In the low-gain operating mode, on the other hand, the potential at each of the drain and source of the RF switch element 22 becomes approximately 0 V so that a dc parasitic resistance when the RF switch element 22 in the ON state is reduced and a loss resulting from the insertion of the RF switch element 22 is also reduced.

If the resistance of the resistor 23 is set to a proper value, oscillation in the high-gain operating mode can be prevented without increasing the number of elements of the circuit.

As shown in FIG. 1, the RF variable gain amplifying device 1A according to the first embodiment features the structure in which the power supply voltage Vcc is not switched to the ground potential. To prevent noise or the like, the bypass capacitor 15 is normally inserted between the supply line for the power supply voltage Vcc and the ground. This causes the problem that, when the high-gain operating mode is switched to the low-gain operation mode by switching the power supply voltage Vcc to the ground potential and thereby changing the output potential of the amplifier 10, the switching of the operating mode cannot be performed promptly under the influence of the bypass capacitor 15. However, since the RF variable gain amplifying device 1A does not perform switching from the power supply voltage Vcc at the power supply terminal 13 to the ground potential, the time required to switch the operating mode can be reduced.

Thus, according to the first embodiment, the drain and source of the RF switch element 22 included in the signal bypass circuit 20 are connected via the resistor 23 for preventing varying isolation so that the potential at each of the drain and source of the RF switch element 22 becomes approximately 0.7 V in the high-gain operating mode and becomes 0 V in the low-gain operating mode. This prevents the drain or source of the RF switch element 22 from being brought into the floating state.

As a result, isolation when the RF switch element 22 is in the OFF state is increased in the high-gain operating mode so that the noise characteristic of the RF variable gain amplifying device in the high-gain operating mode is improved. In the low-gain operating mode, on the other hand, a loss resulting from the insertion of the RF switch element 22 is reduced and oscillation in the high-gain operating mode can be prevented without increasing the number of elements of the circuit.

Figure 3:
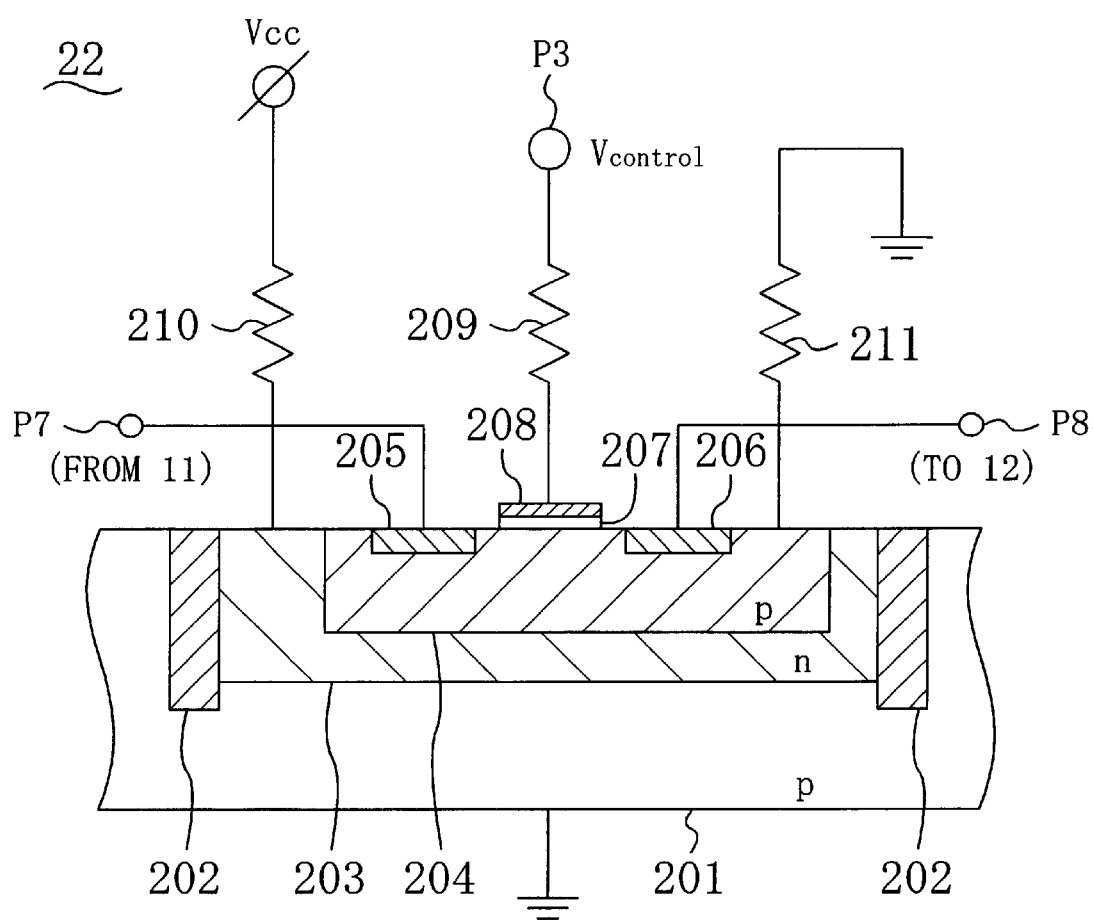
FIG. 3 is a diagrammatical cross-sectional view showing a structure of an exemplary RF switch element for use in the RF variable gain amplifying device according to the first embodiment.

FIG. 3 shows a preferred structure of the RF switch element 22.

FIG. 3 diagrammatically shows a cross-sectional structure of the RF switch element 22 to be used preferably in the RF variable gain amplifying device 1A according to the first embodiment.

As shown in FIG. 3, the RF switch element 22 is formed in a region to be formed with the element which is defined by trench isolation portions 202 provided selectively in a semiconductor substrate 201 composed of, e.g., p-type silicon.

In the element formation region of the semiconductor substrate 201, an n-type well 203 and a p-type well 204 enclosed in the n-type well 203 are formed.

In the p-type well 204, a drain layer 205 and a source layer 206 are formed in mutually spaced apart relation. A gate electrode 208 composed of polysilicon is formed on the region of the p-type well 204 located between the drain layer 205 and the source layer 206.

The drain layer 205 is connected to an input node P7 for receiving an input signal from the input capacitor 11 shown in FIG. 1. The source layer 206 is connected to an output node P8 for outputting an output signal to the output capacitor 12 shown in FIG. 1.

The gate electrode 208 is connected to the voltage control terminal P3 via a first resistor 209, while the n-type well 203 is connected to a power supply voltage terminal via a second resistor 210.

The semiconductor substrate 201 is grounded, while the p-type well layer 204 is grounded via a third resistor 211.

In the RF switch element 22 thus constructed, a reverse bias voltage is applied between the n-type well layer 203 and the p-type well layer 204 so that a depletion layer results from a pn junction composed of the interface between the n-type well layer 203 and the p-type well layer 204. Consequently, the n-type well layer 203 and the p-type well layer 204 are dielectrically isolated in directions perpendicular to each other relative to a substrate surface. Since a reverse bias voltage is also applied between the semiconductor substrate 201 and the n-type well layer 203, a depletion layer results from a pn junction composed of the interface between the semiconductor substrate 201 and the n-type well layer 203 so that the semiconductor substrate 201 and the n-type well layer 203 are dielectrically isolated from each other.

When the RF switch element 22 is in the ON state, therefore, a loss in an RF signal inputted to the input node P7 resulting from the leakage of the input signal from a channel region formed between the source layer 206 and the drain layer 205 to the semiconductor substrate 201 can be reduced so that a loss resulting from the insertion of the RF switch element 22 in the low-gain operating mode is reduced.

By using a so-called triple well structure as described above, the leakage of the RF signal inputted to the input node P7 to the semiconductor substrate 201 through the drain layer 205 can be reduced even if the RF switch element 22 is in the OFF state. This lessens a deteriorated noise characteristic resulting from the loss of a part of the RF signal inputted to the input terminal P1 shown in FIG. 1 which results from the insertion of the RF switch element 22 in the high-gain operating mode.

Instead of the first, second, and third resistors 209, 210, and B211, respective inductor elements may also be used.

Variation 1 of Embodiment 1

Referring to the drawings, a first variation of the first embodiment according to the present invention will be described.

Figure 4:
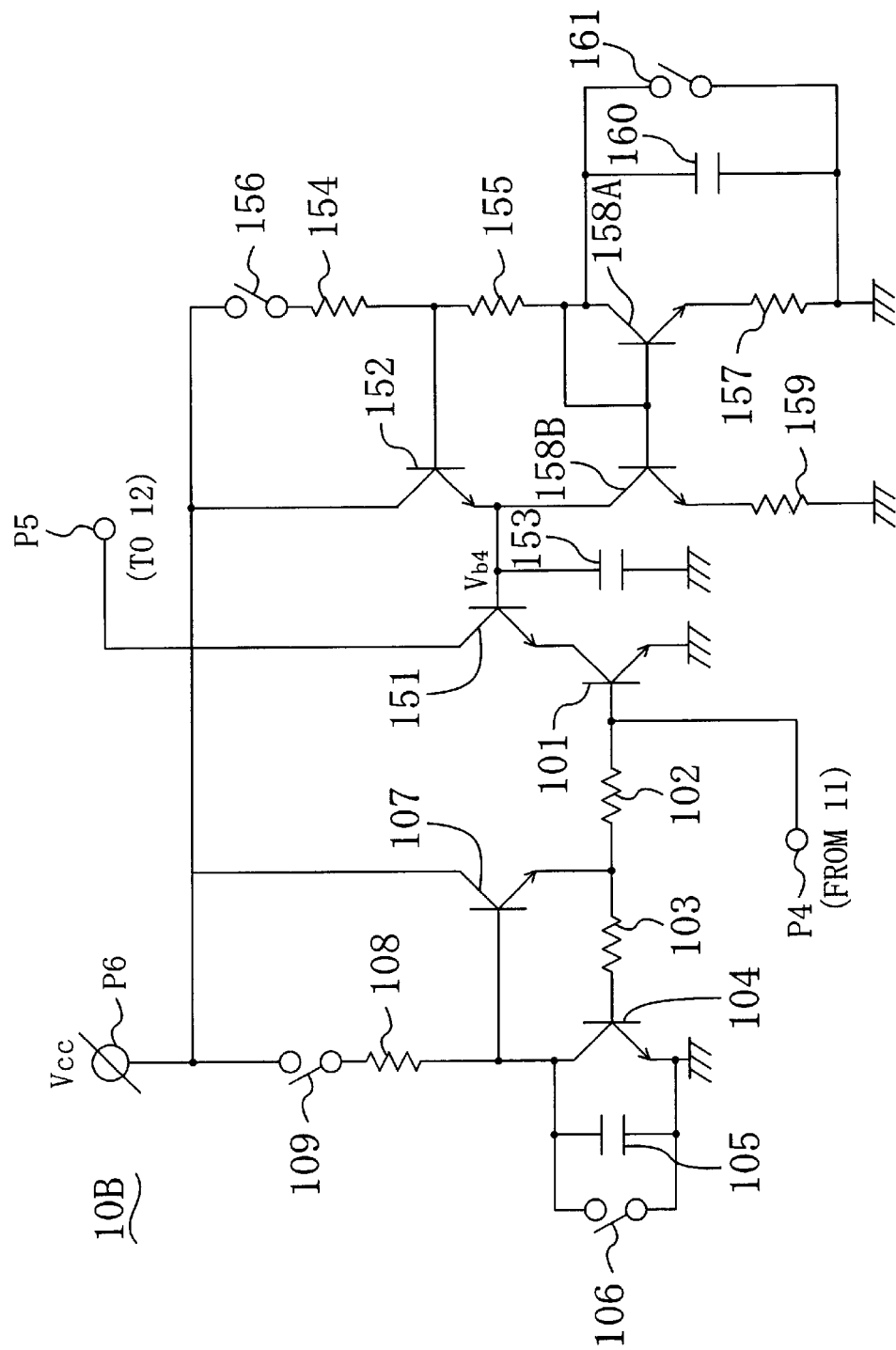
FIG. 4 is a circuit diagram of an exemplary amplifying circuit in an RF variable gain amplifying device according to a first variation of the first embodiment.

FIG. 4 shows an exemplary configuration of an amplifying circuit for use in an RF variable gain amplifying device according to the first variation. The description of components shown in FIG. 4 which are the same as those shown in FIG. 2 is omitted by retaining the same reference numerals.

An amplifying circuit 10B according to the first variation is characterized in that amplifying elements for an inputted RF signal are in a cascode connection. Specifically, a first bipolar transistor 101 having an emitter which is grounded and a fourth bipolar transistor 151 having an emitter connected to the collector of the first bipolar transistor 101, a base which is grounded, and a collector connected to the output node P5 are connected in series.

The base of the fourth bipolar transistor 151 is connected to the emitter of a fifth bipolar transistor 152, while it is grounded via a second bypass capacitor 153.

The fourth bipolar transistor 152 has a collector connected to the power supply terminal P6 and a base connected to a common connecting portion of fourth and fifth resistors 154 and 155 connected in series.

The terminal of the fourth resistor 154 opposite to the common connecting portion is connected to a power supply terminal P6 via a third DC switch 156. The terminal of the fifth resistor 155 opposite to the common connecting portion is connected to a sixth bipolar transistor 158A.

The sixth bipolar transistor 158A has a collector and a base connected to each other. The base of the sixth bipolar transistor 158A is connected to the base of a seventh bipolar transistor 158B, while the emitter of the sixth bipolar transistor 158A is grounded via a sixth resistor 157.

The seventh bipolar transistor 158B and the sixth bipolar transistor 158A compose a current mirror circuit. The collector of the seventh bipolar transistor 158B is connected to the base of the fourth bipolar transistor 151 and to the emitter of the fifth bipolar transistor 152, while the emitter of the seventh bipolar transistor 158B is grounded via a seventh resistor 159.

The collector of the sixth bipolar transistor 158A is grounded via a third bypass capacitor 160 and a fourth DC switch 161 which are connected in parallel.

A description will be given next to the operation of the amplifying circuit 10B thus constructed.

High-Gain Operating Mode

A potential at the voltage control terminal P3 shown in FIG. 1 becomes approximately 0 V. In the amplifying circuit 10B shown in FIG. 4, the first DC switch 106 and the fourth DC switch 161 are brought into the OFF state, while the second DC switch 109 and the third DC switch 156 are brought into the ON state.

If the respective resistances of the fourth, fifth, and sixth resistors 154, 155, and 157 are assumed to be R4, R5, and R6, the base-bias voltage Vb4 of the fourth bipolar transistor 151 is given by the following expression (1):

$$Vb4=(Vcc-0.7)(R5+R6)/(R4+R5+R6) \quad (1).$$

Accordingly, the amplifying circuit 10 shown in FIG. 1 is brought into the ON state and the RF switch element 22 of the signal bypass circuit 20 is brought into the OFF state, similarly to the first embodiment.

Low-Gain Operating Mode

In the low-gain operating mode, a voltage at the voltage control terminal P3 shown in FIG. 1 becomes the power supply voltage Vcc. In the amplifying circuit 10B shown in FIG. 4, the first DC switch 106 and the fourth DC switch 161 are brought into the ON state, while the second DC switch 109 and the third DC switch 156 are brought into the OFF state. Consequently, the base-bias voltage Vb4 of the fourth bipolar transistor 151 becomes approximately 0 V.

Since the base voltage of the first bipolar transistor 101 becomes approximately 0 V with the closing of the first DC switch 106, similarly to the first embodiment, the amplifying circuit 10B is brought into the OFF state. On the other hand, the voltage between the gate and back gate of the RF switch element 22 becomes about the power supply voltage Vcc so that the RF switch element 22 is brought into the ON state.

In the first embodiment described above, the power supply voltage Vcc is supplied from the power supply terminal 13 shown in FIG. 1 to the collector of the first bipolar transistor 101 even in the low-gain operating mode. If a strong-electric-field signal is inputted to the input terminal P1 and a dc current flows from the base of the first bipolar transistor 101 to the emitter thereof, a current also flows from the collector of the first bipolar transistor 101 to the emitter thereof. As a result, a distorted signal is outputted from the first bipolar transistor 101 to the output terminal P2.

By contrast, the amplifying circuit 10B according to the first variation has adopted a cascode amp configuration composed of the first bipolar transistor 101 and the fourth bipolar transistor 151 and adjusted the base-bias voltage Vb4 of the fourth bipolar transistor 151 in the low-gain operating mode to approximately 0 V, thereby reducing a current flowing in the first and fourth bipolar transistors 101 and 151 when the strong-electric-field signal is inputted to the input terminal P1 and reducing the level of the distorted signal outputted to the output terminal P2.

Preferably, the MOSFET shown in FIG. 3 is used for the RF switch element 22.

Variation 2 of Embodiment 1

Referring to the drawings, a second variation of the first embodiment according to the present invention will be described.

Figure 5:
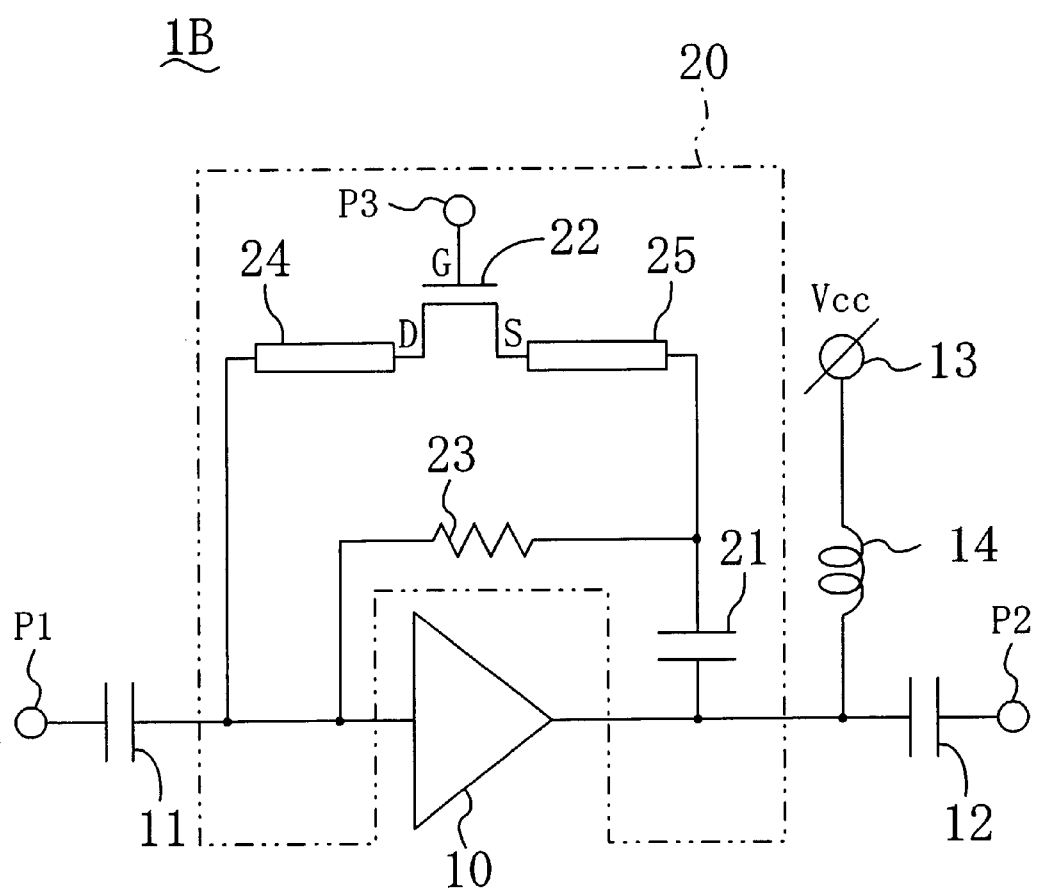
FIG. 5 is a circuit diagram of an RF variable gain amplifying device according to a second variation of the first embodiment.

FIG. 5 shows a circuit configuration of an RF variable gain amplifying device according to the second variation. The description of components shown in FIG. 5 which are the same as those shown in FIG. 1 is omitted by retaining the same reference numerals.

An RF variable gain amplifying device 1B according to the second variation is characterized in that a first strip line 24 is provided between the drain of the RF switch element 22 and the input capacitor 11 in the signal bypass circuit 20 and that a second strip line 25 is provided between the source of the RF switch element 22 and the capacitor 21 for bypass circuit.

As the amplifying circuit 10, the amplifying circuit 10A shown in FIG. 2 or the amplifying circuit 10B shown in FIG. 4 may be used appropriately.

In a typical conventional RF variable gain amplifying device, there are cases where an input impedance and an output impedance in the high-gain operating mode differ greatly from those in the low-gain operating mode. In the RF variable gain amplifying device 1B according to the second variation, by contrast, the input impedance of the RF switch element 22 can be changed by changing the respective characteristic impedances or lengths of the first and second strip lines 24 and 25 or changing the capacitance of the capacitor 21 for bypass circuit.

This brings the input and output impedances in the high-gain operating mode closer to the input and output impedances in the low-gain operating mode so that a loss resulting from mismatched impedances at the input and output terminals P1 and P2 in the two operating modes is reduced.

Thus, according to the second variation, the loss resulting from the mismatched impedances in the high-gain and low-gain operating modes can be reduced with a simple structure by properly setting the respective impedances or lengths of the first and second strip lines 24 and 25 provided in the signal bypass circuit 20 or the capacitance of the capacitor 21 for bypass circuit provided in the signal bypass circuit 20.

Preferably, the MOSFET shown in FIG. 3 is used for the RF switch element 22.

Of the first and second strip lines 24 and 25, either one may be provided appropriately. Instead of the strip line, a coplanar line may also be used appropriately. Instead of the RF line, an inductor element may also be used appropriately.

Variation 3 of Embodiment 1

Referring to the drawings, a third variation of the first embodiment according to the present invention will be described.

Figure 6:
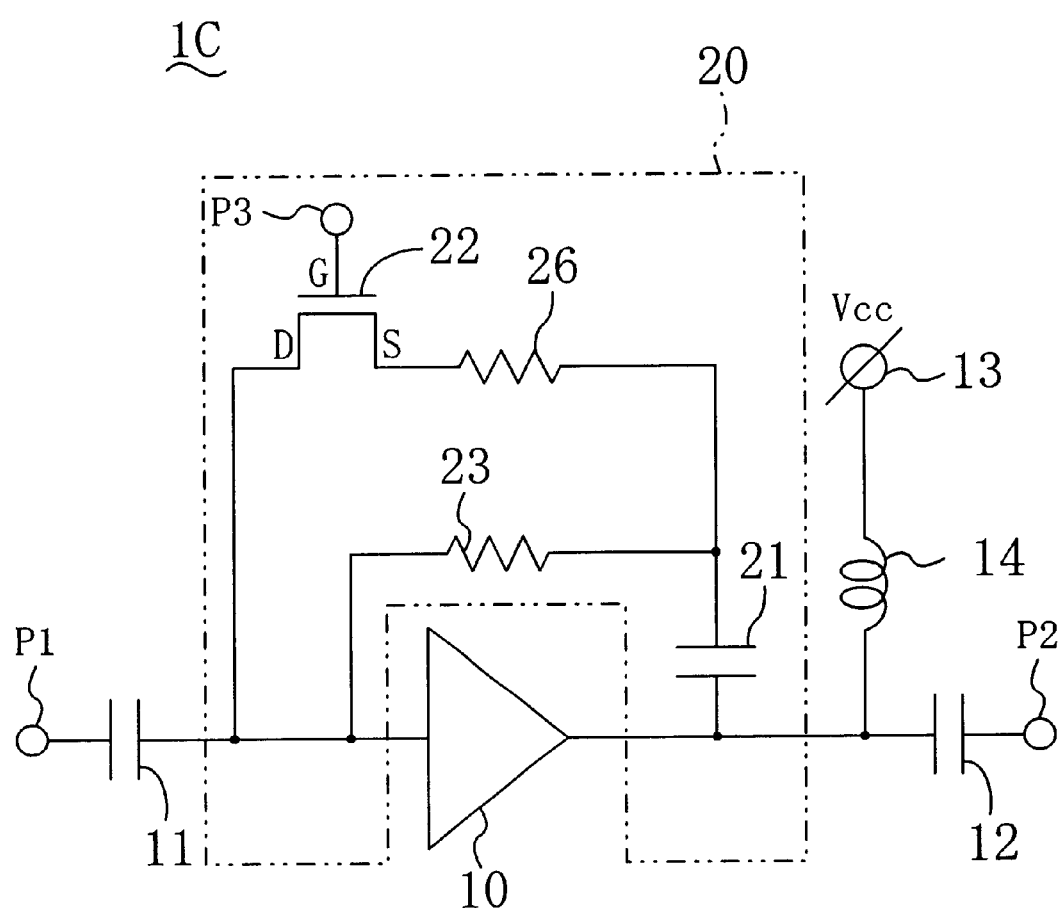
FIG. 6 is a circuit diagram of an RF variable gain amplifying device according to a third variation of the first embodiment.

FIG. 6 shows a circuit configuration of an RF variable gain amplifying device according to the third variation. The description of components shown in FIG. 6 which are the same as those shown in FIG. 1 is omitted by retaining the same reference numerals.

As shown in FIG. 6, an RF variable gain amplifying device 1C according to the third variation is characterized in that a variation preventing resistor 26 composed of, e.g., polysilicon and having a resistance of about 20 Ω to 50 Ω is provided between the source of the RF switch element 22 and the capacitor 21 for bypass circuit in the signal bypass circuit 20.

In the third embodiment also, the amplifying circuit 10A shown in FIG. 2 or the amplifying circuit 10B shown in FIG. 4 may be used appropriately for the amplifying circuit 10.

To widen the dynamic range of a received RF signal, the conventional RF variable gain amplifying device typically reduces the size of the FET composing the RF switch element 22, thereby increasing the insertion loss and increasing an amount of attenuation in the low-gain operating mode. However, the ON-state resistance of the FET varies greatly depending on the fabrication process therefor so that the insertion loss also varies greatly.

In the RF variable gain amplifying device IC according to the third variation, by contrast, the resistor composed of polysilicon and exhibiting a relatively small variation during fabrication and the like are connected in series. The arrangement reduces variations in loss resulting from the insertion of the RF switch element 22 and thereby further widens the dynamic range of a receivable RF signal.

Thus, according to the third variation, the dynamic range of a receivable RF signal can further be widened with a simple structure by properly setting the resistance of the variation preventing resistor 26 provided in series with the signal bypass circuit 20.

Preferably, the MOSFET shown in FIG. 3 is used for the RF switch element 22.

It is also possible to replace any of the first, second, third, fourth, and fifth bipolar transistors 101, 104, 107, 151, and 152 with a FET.

The variation preventing resistor 26 may also be provided appropriately between the RF switch element 22 and the input capacitor 11.

Embodiment 2

Referring to the drawings, a second embodiment of the present invention will be described.

Figure 7:
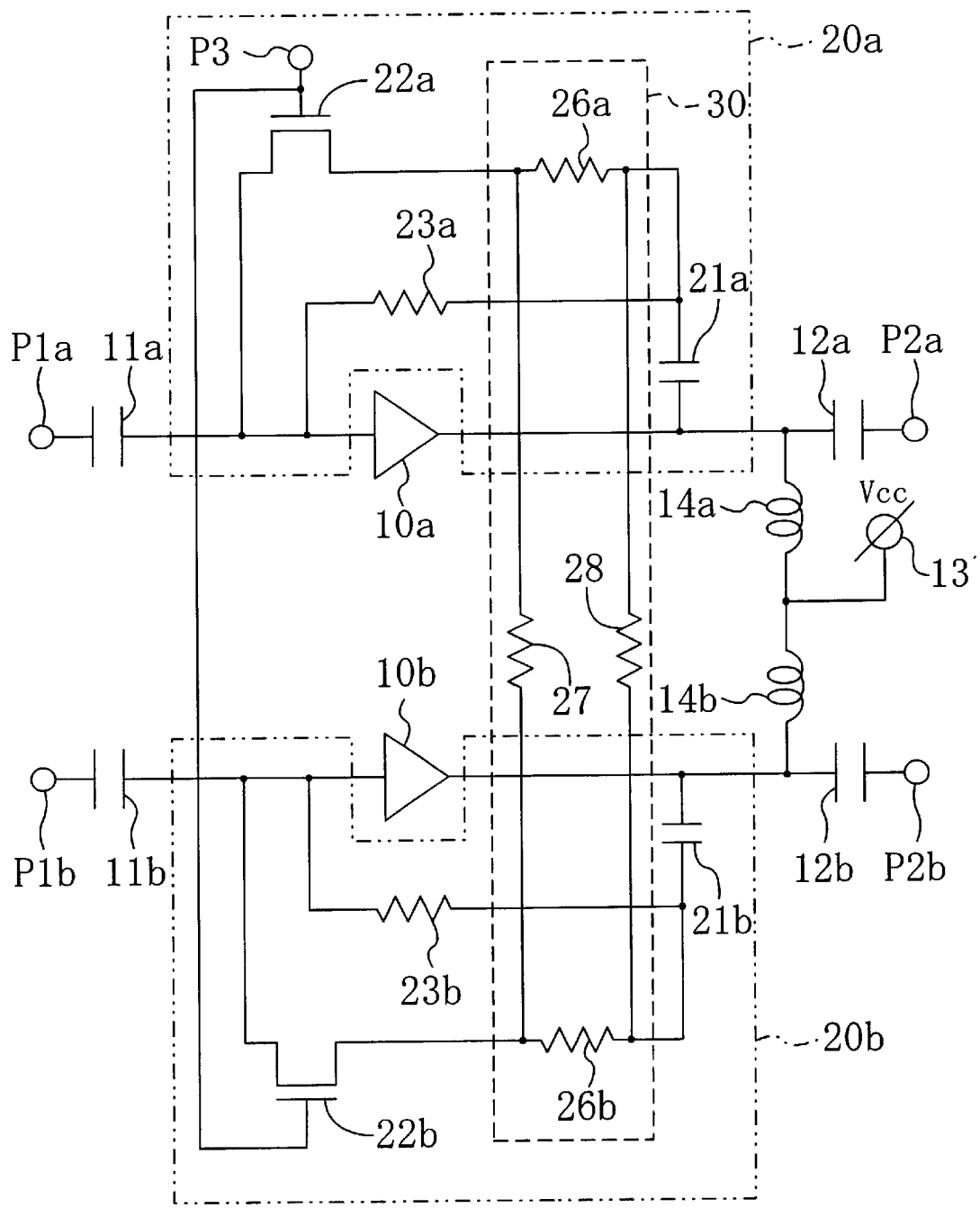
FIG. 7 is a circuit diagram of an RF variable gain amplifying device according to a second embodiment of the present invention.

FIG. 7 shows a circuit configuration of an RF variable gain amplifying device according to the second variation. The description of components shown in FIG. 7 which are the same as those shown in FIG. 6 is omitted by retaining the same reference numerals.

An RF variable gain amplifying device 1D according to the second embodiment is configured as a differential amplifying circuit including a pair of RF variable gain amplifying devices 1C according to the third variation of the first embodiment and features first and second signal bypass circuits 20a and 20b.

As shown in FIG. 7, a first amplifier 10a is connected to a first input terminal P1a via a first input capacitor 11a and to a first output terminal P2a via a first output capacitor 12a.

Likewise, a second amplifier 10b is connected to a second input terminal P1b via a second input capacitor 11b and to a second output terminal P2b via a second output capacitor 12b.

The first and second input terminals P1a and P1b receive RF signals having the same amplitude and a 180° phase shift therebetween. Likewise, the first and second input terminals P1a and P2b output RF signals having the same amplitude and a 180° phase shift therebetween.

In a first signal bypass circuit 20a, a first RF switch element 22a and a first resistor 23a are connected in parallel with the first amplifying circuit 10a via a first capacitor 21a for bypass circuit provided on the output side of the first amplifying circuit 10a. A first variation preventing resistor 26a is connected in series between the source of the first RF switch element 22a and the first capacitor 21a for bypass circuit.

In a second signal bypass circuit 20b also, a second RF switch element 22b and a second resistor 23b are connected in parallel with the second amplifying circuit 10b via a second capacitor 21b for bypass circuit provided on the output side of the second amplifying circuit 10b. A second variation preventing resistor 26b is connected in series between the source of the second RF switch element 22b and the second capacitor 21b for bypass circuit.

A power supply terminal 13 is connected to the output side of the first amplifying circuit 10a via a first choke coil 14a and to the output side of the second amplifying circuit 10b via a second choke coil 14b.

The respective terminals of the first and second variation preventing resistors 26a and 26b which are closer to the respective drains of the RF switch elements 22a and 22b are connected to each other with a first attenuating resistor 27, while the respective terminals of the first and second variation preventing resistors 26a and 26b which are opposite to the drain-side terminals are connected to each other with a second attenuating resistor 28. The resistors 26a, 26b, 27 and 28 constitute a π-type attenuator 30 capable of attenuating an RF signal inputted in the low-gain operating mode.

As each of the first and second amplifying circuits 10a and 10b, the amplifying circuit 10A shown in FIG. 2 or the amplifying circuit 10B shown in FIG. 4 may be used appropriately.

A description will be given herein below to the operation of the RF variable gain amplifying device 1D thus constructed.

As described in the first embodiment, each of the first and second amplifying circuits 10a and 10b is brought into the ON state in the high-gain operating mode so that a potential at the voltage control terminal P3 becomes approximately 0 V, which brings each of the first and second RF switch elements 22a and 22b into the OFF state.

In the low-gain operating mode, on the other hand, each of the first and second amplifying circuits 10a and 10b is brought into the OFF state so that the potential at the voltage control terminal P3 becomes the power supply potential Vcc, which brings each of the first RF switch element 22a of the first signal bypass circuit 20a and the second RF switch element 22b of the second signal bypass circuit 20b into the ON state. In the low-gain operating mode, the differential π-type attenuator 30 further attenuates the inputted RF signal.

Figure 8:
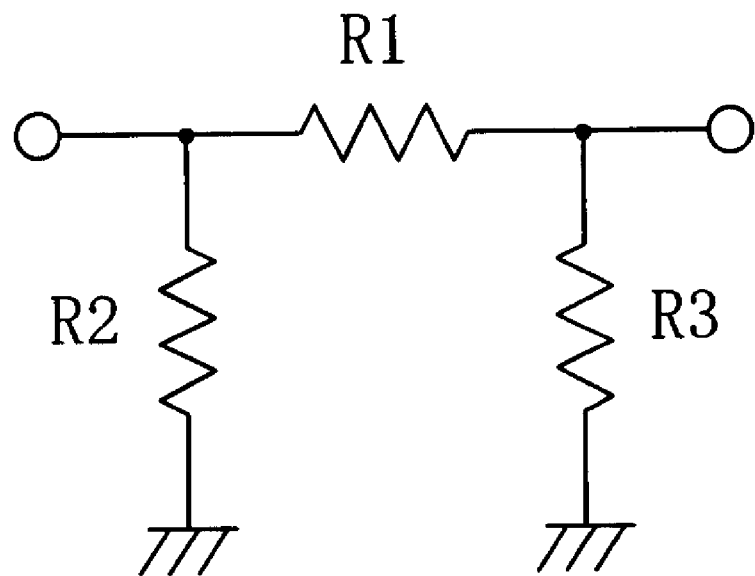
FIG. 8 is a circuit diagram of a conventional π-type attenuator.
Figure 9:
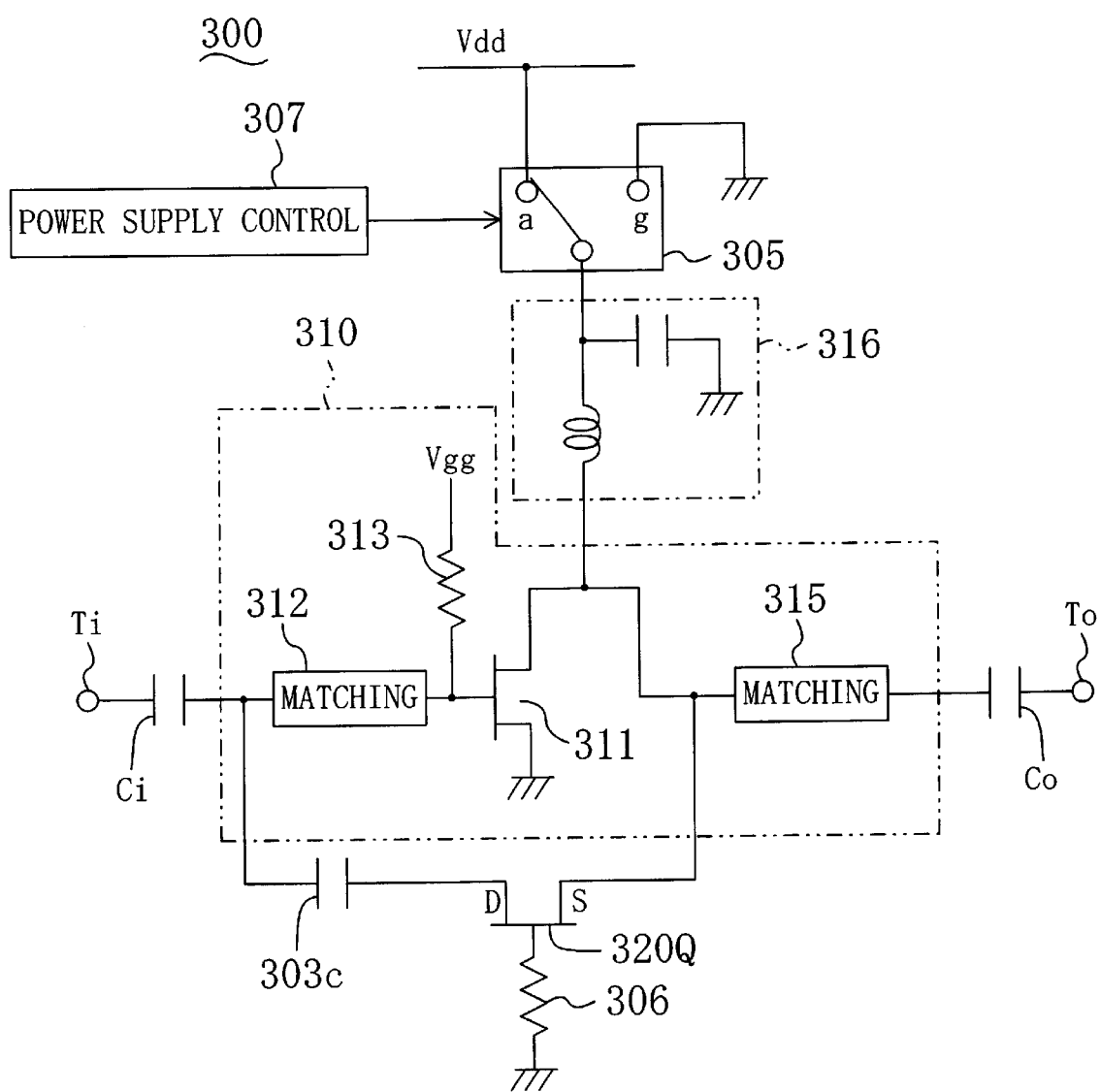
FIG. 9 is a circuit diagram of a conventional RF variable gain amplifying device.

As shown in FIG. 8, a non-differential π-type attenuator 31 is composed of a first resistor R1, a second resistor R2, and a third resistor R3. The second and third resistors R2 and R3 have respective one terminals connected to the both terminals of the first resistor R1, while having the respective other terminals grounded.

The π-type attenuator 31 shown in FIG. 8 is typically an excellent attenuator capable of adjusting an amount of attenuation and input and output impedances simultaneously. If the π-type attenuator 31 is used in series with the RF switch element 22 of a non-differential RF variable gain amplifying device, however, a signal current flows to the ground via each of the resistors R2 and R3 of the π-type attenuator 31 in the high-gain operating mode so that a consumed current is increased disadvantageously.

To prevent the leakage of the signal current due to the π-type attenuator 30, the second embodiment adopts a differential circuit configuration and uses a virtual ground point for the π-type attenuator 30.

Since the second embodiment widens the dynamic range of an RF signal that can be received by the RF variable gain amplifying device, similarly to the third variation of the first embodiment, and can adjust the input and output impedances by using the differential π-type attenuator 30, the input and output impedances in the high-gain and low-gain operating modes can be brought closer to equal values. This reduces a loss resulting from mismatched impedances at each of the input terminals P1a and P1b and the output terminals P2a and P2b in the two operating modes.

Thus, according to the second embodiment, the dynamic range of a receivable RF signal can be widened with a simple structure and a loss resulting from mismatched impedances in the high-gain and low-gain operating modes can be reduced by using the first and second differential amplifying circuits 10a and 10b and providing the π-type attenuator 30 providing a connection between the first and second signal bypass circuits 20a and 20b.

Preferably, the MOSFET shown in FIG. 3 is used for the RF switch element 22.

A strip line or a coplanar line may also be inserted in series with each of the RF switch elements 22a and 22b. Instead of an RF line, an inductor element may also be used.

What is claimed is:

1. An RF variable gain amplifying comprising:
    an amplifying circuit;
    a switch element connected in parallel with the amplifying circuit; and
    a resistor connected in parallel with the amplifying circuit and with the switch element,
    the amplifying circuit not operating when the switch element is in an ON state but operating when the switch element is in an OFF state,
    a DC potential at each of input and output terminals of the switch element being lower when the switch element is in the ON state than when the switch element is in the OFF state.

2. The RF variable gain amplifying device of claim 1, wherein
    the amplifying circuit has a bipolar transistor,
    an input signal to the amplifying circuit is inputted to a base of the bipolar transistor, and
    an output signal from the amplifying circuit is outputted from a collector of the bipolar transistor.

3. The variable gain amplifying device of claim 1, wherein
    the amplifying circuit has a first bipolar transistor and a second bipolar transistor having an emitter connected to a collector of the first bipolar transistor,
    an input signal to the amplifying circuit is inputted to a base of the first bipolar transistor, and
    an output signal from the amplifying circuit is outputted from a collector of the second bipolar transistor.

4. The RF variable gain amplifying device of claim 1, wherein another resister is provided in a stage subsequent to the switch element.

5. An RF variable gain amplifying comprising:
    an amplifying circuit;
    a switch element connected in parallel with the amplifying circuit; and
    a resistor connected in parallel with the amplifying circuit and with the switch element,
    the amplifying circuit not operating when the switch element is in an ON state but operating when the switch element is in an OFF state,
    a potential at each of input and output terminals of the switch element being lower when the switch element is in the ON state than when the switch element is in the OFF state,
    wherein the amplifying circuit has a first bipolar transistor and a second bipolar transistor having an emitter connected to a collector of the first bipolar transistor, an input signal to the amplifying circuit is input to a base of the first bipolar transistor, and an output signal from the amplifying circuit is output from a collector of the second bipolar transistor,
    wherein a potential at a base of the second bipolar transistor is lower when the switch element is in the ON state than when the witch element is in the OFF state.

6. An RF variable gain amplifying comprising:
    an amplifying circuit;
    a switch element connected in parallel with the amplifying circuit; and
    a resistor connected in parallel with the amplifying circuit and with the switch element,
    the amplifying circuit not operating when the switch element is in an ON state but operating when the switch element is in an OFF state,
    a potential at each of input and output terminals of the switch element being lower when the switch element is in the ON state than when the switch element is in the OFF state, wherein a strip line is provided between the input terminal of the amplifying circuit and the switch element.

7. An RF variable gain amplifying comprising:
    an amplifying circuit;
    a switch element connected in parallel with the amplifying circuit; and
    a resistor connected in parallel with the amplifying circuit and with the switch element,
    the amplifying circuit not operating when the switch element is in an ON state but operating when the switch element is in an OFF state,
    a potential at each of input and output terminals of the switch element being lower when the switch element is in the ON state than when the switch element is in the OFF state, wherein a strip line is provided between the output terminal of the amplifying circuit and the switch element.

8. An RF variable gain amplifying comprising:
    an amplifying circuit;
    a switch element connected in parallel with the amplifying circuit; and
    a resistor connected in parallel with the amplifying circuit and with the switch element,
    the amplifying circuit not operating when the switch element is in an ON state but operating when the switch element is in an OFF state,
    a potential at each of input and output terminals of the switch element being lower when the switch element is in the ON state than when the switch element is in the OFF state, wherein a coplanar line is provided between the input terminal of the amplifying circuit and the switch element.

9. An RF variable gain amplifying comprising:
    an amplifying circuit;
    a switch element connected in parallel with the amplifying circuit; and
    a resistor connected in parallel with the amplifying circuit and with the switch element,
    the amplifying circuit not operating when the switch element is in an ON state but operating when the switch element is in an OFF state, a potential at each of input and output terminals of the switch element being lower when the switch element is in the ON state than when the switch element is in the OFF state, wherein a coplanar line is provided between the output terminal of the amplifying circuit and the switch element.

10. An RF variable gain amplifying comprising:
an amplifying circuit;
a switch element connected in parallel with the amplifying circuit; and
a resistor connected in parallel with the amplifying circuit and with the switch element,
the amplifying circuit not operating when the switch element is in an ON state but operating when the switch element is in an OFF state,
a potential at each of input and output terminals of the switch element being lower when the switch element is in the ON state than when the switch element is in the OFF state, wherein an inductor element is provided between the input terminal of the amplifying circuit and the switch element.

11. An RF variable gain amplifying comprising:
an amplifying circuit;
a switch element connected in parallel with the amplifying circuit; and
a resistor connected in parallel with the amplifying circuit and with the switch element,
the amplifying circuit not operating when the switch element is in an ON state but operating when the switch element is in an OFF state,
a potential at each of input and output terminals of the switch element being lower when the switch element is in the ON state than when the switch element is in the OFF state, wherein an inductor element is provided between the output terminal of the amplifying circuit and the switch element.

12. An RF variable gain amplifying comprising:
an amplifying circuit;
a switch element connected in parallel with the amplifying circuit; and
a resistor connected in parallel with the amplifying circuit and with the switch element,
the amplifying circuit not operating when the witch element is in an ON state but operating when the switch element is in an OFF state,
a potential at each of input and output terminals of the switch element being lower when the switch element is in the ON state that when the switch element is in the OFF state, wherein the switch element is composed of a field effect transistor having a gate electrode formed on a semiconductor substrate and source and drain layers of a first conductivity type each formed in the semiconductor substrate,
the source and drain layers are formed in a first well of a second conductivity type of the semiconductor substrate, and the first well is formed in a second well of the first conductivity type of the semiconductor substrate.

13. The RF variable gain amplifying device of claim 12, wherein respective resistors are provided between the gate electrode and a voltage control node, between the first well and a ground node, and between the second well and a power supply voltage node.

14. The RF variable gain amplifying device of claim 12, wherein respective inductor elements are provided between the gate electrode and a voltage control node, between the first well and a ground node, and between the second well and a power supply voltage node.

15. An RF variable gain amplifying device comprising:
first and second amplifying circuits for receiving first and second input signals, respectively;
first and second switch elements connected in parallel with the first and second amplifying circuits, respectively;
a first resistor connected in parallel with the first amplifying circuit and with the first switch element; and
a second resistor connected in parallel with the second amplifying circuit and with the second switch element,
the first amplifying circuit not operating when the first switch element is in an ON state but operating when the first switch element is in an OFF state,
the second amplifying circuit not operating when the second switch element is in an ON state but operating when the second switch element is in an OFF state,
a potential at each of input and output terminals of the first switch element being lower when the first switch element is in the ON state than when the first switch element is in the OFF state,
a potential at each of input and output terminals of the second switch element being lower when the second switch element is in the ON state than when the second switch element is in the OFF state.

16. The RF variable gain amplifying device of claim 15, wherein
a third resistor is provided between the output terminal of the first amplifying circuit and the first switch element,
a fourth resistor is provided between the output terminal of the second amplifying circuit and the second switch element,
a fifth resistor is provided between respective input terminals of the third and fourth resistors, and
a sixth resistor is provided between respective output terminals of the third and fourth resistors.

17. The RF variable gain amplifying device of claim 15, wherein
the first and second amplifying circuits have respective bipolar transistors,
an input signal to the first amplifying circuit is inputted to a base of the bipolar transistor of the first amplifying circuit, while an output signal from the first amplifying circuit is outputted from a collector of the bipolar transistor of the first amplifying circuit, and
an input signal to the second amplifying circuit is inputted to a base of the bipolar transistor of the second amplifying circuit, while an output signal from the second amplifying circuit is outputted from a collector of the bipolar transistor of the second amplifying circuit.

18. The RF variable gain amplifying device of claim 15, wherein
the first amplifying circuit has a first bipolar transistor and a second bipolar transistor having an emitter connected to a collector of the first bipolar transistor,
an input signal to the first amplifying circuit is inputted to a base of the first bipolar transistor, while an output signal from the first amplifying circuit is outputted from a collector of the second bipolar transistor,
the second amplifying circuit has a third bipolar transistor and a fourth bipolar transistor having an emitter connected to a collector of the third bipolar transistor, and an input signal to the second amplifying circuit is inputted to a base of the third bipolar transistor and an output signal from the second amplifying circuit is outputted from a collector of the fourth bipolar transistor.

19. The RF variable gain amplifying device of claim 18, wherein
- a potential at a base of the second bipolar transistor is lower when the first switch element is in the ON state than when the first switch element is in the OFF state and
- a potential at a base of the fourth bipolar transistor is lower when the second switch element is in the ON state than when the second switch element is in the OFF state.

20. The RF variable gain amplifying device of claim 15, wherein respective strip lines are provided between the input terminal of the first amplifying circuit and the first switch element and between the input terminal of the second amplifying circuit and the second switch element.

21. The RF variable gain amplifying device of claim 15, wherein respective strip lines are provided between the output terminal of the first amplifying circuit and the first switch element and between the output terminal of the second amplifying circuit and the second switch element.

22. The RF variable gain amplifying device of claim 15, wherein respective coplanar lines are provided between the input terminal of the first amplifying circuit and the first switch element and between the input terminal of the second amplifying circuit and the second switch element.

23. The RF variable gain amplifying device of claim 15, wherein respective coplanar lines are provided between the output terminal of the first amplifying circuit and the first switch element and between the output terminal of the second amplifying circuit and the second switch element.

24. The RF variable gain amplifying device of claim 15, wherein respective inductor elements are provided between the input terminal of the first amplifying circuit and the first switch element and between the input terminal of the second amplifying circuit and the second switch element.

25. The RF variable gain amplifying device of claim 15, wherein respective inductor elements are provided between the output terminal of the first amplifying circuit and the first switch element and between the output terminal of the second amplifying circuit and the second switch element.

26. The RF variable gain amplifying device of claim 15, wherein
- each of the first and second switch elements is composed of a field effect transistor having a gate electrode formed in a semiconductor substrate and source and drain layers of a first conductivity type each formed in the semiconductor substrate,
- the source and drain layers are formed in a first well of a second conductivity type of the semiconductor substrate, and
- the first well is formed in a second well of the first conductivity type of the semiconductor substrate.

27. The RF variable gain amplifying device of claim 26, wherein respective resistors are provided between the gate electrode and a voltage control node, between the first well and a ground node, and between the second well and a power supply voltage node.

28. The RF variable gain amplifying device of claim 26, wherein respective inductor elements are provided between the gate electrode and a voltage control node, between the first well and a ground node, and between the second well and a power supply voltage node.

* * * * *

UNITED STATES PATENT AND TRADEMARK OFFICE
CERTIFICATE OF CORRECTION

PATENT NO.  : 6,667,657 B2
DATED       : December 23, 2003
INVENTOR(S) : Toshifumi Nakatani et al.

It is certified that error appears in the above-identified patent and that said Letters Patent is hereby corrected as shown below:

<u>Column 17,</u>
Line 50, delete "that" insert -- than --;

Signed and Sealed this

Fifteenth Day of June, 2004

JON W. DUDAS
*Acting Director of the United States Patent and Trademark Office*